(12) United States Patent
Lee

(10) Patent No.: US 7,468,319 B2
(45) Date of Patent: Dec. 23, 2008

(54) METHOD FOR PREVENTING A METAL CORROSION IN A SEMICONDUCTOR DEVICE

(75) Inventor: Jae Suk Lee, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 72 days.

(21) Appl. No.: 11/179,455

(22) Filed: Jul. 11, 2005

(65) Prior Publication Data

US 2006/0019492 A1 Jan. 26, 2006

(30) Foreign Application Priority Data

Jul. 20, 2004 (KR) ............... 10-2004-0056363

(51) Int. Cl.
*H01L 21/44* (2006.01)
(52) U.S. Cl. ............... 438/652; 438/706; 438/688; 438/656
(58) Field of Classification Search ........... 438/652, 438/706, 688, 656
See application file for complete search history.

(56) References Cited

U.S. PATENT DOCUMENTS 4,949,671 A * 8/1990 Davis et al. ............ 118/725
5,776,832 A * 7/1998 Hsieh et al. ............ 438/669
5,943,601 A * 8/1999 Usui et al. ............. 438/688
2001/0045646 A1* 11/2001 Shields et al. .......... 257/734
2003/0098501 A1* 5/2003 Lee et al. .............. 257/678

FOREIGN PATENT DOCUMENTS

| KR | 0180347 | 4/1999 |
| KR | 2000-0027241 | 5/2000 |
| KR | 2001-0035852 | 5/2001 |

OTHER PUBLICATIONS

S. Wolf and R.N. Tauber, (Silicon Processing for the VLSI Era, vol. 1-Process Technology, Lattice Press, 1986) (pp. 182-188).*

* cited by examiner

*Primary Examiner*—Duy-Vu Deo
*Assistant Examiner*—Mahmoud Dahimene
(74) *Attorney, Agent, or Firm*—Andrew D. Fortney

(57) ABSTRACT

The present invention relates to a method for preventing a metal corrosion in a semiconductor device. The present method includes the steps of etching of a metal layer in a chamber, the metal layer having a photoresist pattern thereon or thereover; oxidizing a surface of the metal layer using a plasma comprising $N_2O$ in the same chamber; and removing the photoresist. Therefore, metal corrosion as well as bridges between metal wirings can be suppressed or prevented, thereby improving the profile of metal layer and the reliability and yield of the semiconductor device.

19 Claims, 4 Drawing Sheets

N₂O PLASMA

METHOD FOR PREVENTING A METAL CORROSION IN A SEMICONDUCTOR DEVICE

BACKGROUND OF THE INVENTION

1. Field of the Invention

The present invention relates to semiconductor device manufacturing technology. More specifically, the present invention relates to a method for preventing corrosion of a metal layer in a semiconductor device, thereby enabling improvement of the reliability and yield of a semiconductor device.

2. Description of the Related Art

Following the rapid progress of information and communication media such as a computer, the technology of manufacturing a semiconductor device has been rapidly developed. A semiconductor device has been developed toward higher integration, miniaturization, and higher operational speed.

Currently, aluminum or aluminum alloys are widely used as a wiring material for integrated circuits such as VLSI (Very Large-Scale Integration) devices, because of their superior electric conductivity and low prices. Processes of forming aluminum wiring generally comprise the steps of: forming an aluminum layer; coating and patterning a photoresist on the aluminum layer; etching an exposed portion of the aluminum layer (i.e., which is not covered with the photoresist) by means of plasma including chlorine; and removing the photoresist.

FIGS. 1a to 1c are cross-sectional views of a semiconductor device illustrating a conventional method for forming an aluminum wiring in the semiconductor device.

First, as shown in FIG. 1a, a photoresist is coated and patterned over a substrate 100 on which an oxide layer 102, barrier 104, aluminum layer 106 and antireflective coating 108 are formed in due order. Then, the antireflective coating 108, aluminum layer 106 and barrier 104 are dry-etched by means of Reactive Ion Etching (RIE) using a chlorine source gas such as $Cl_2$, $BCl_3$ and the like. Here, the patterned photoresist 110 is used as a mask for this etching process.

Next, as shown in FIG. 1b, the patterned photoresist 110 is removed by means of $O_2$ plasma ashing process. At this time, corrosion defects 112 on a surface of aluminum layer 106 may result from circumstances such as fluorine, $NH_4OH$, water, etc., working conditions of RIE, cleaning solutions used for removal of a photoresist, and especially chlorine residues occurring during the etch of aluminum layer 106. The corrosion defects 112 deteriorate the electrical performance of the semiconductor device or integrated circuit, or cause failures such as a short circuit thus decreasing the yield of manufacturing the semiconductor device.

In order to prevent such corrosion defects, the following methods are conventionally used. A first method involves cleaning the chlorine residues using deionized water, usually as a spray or in a bath. A second method involves evaporating the chlorine residues by heat treatment. A third method involves using a plasma containing fluorine.

However, the first method has little effect on removal of the chlorine residues, and generally does not prevent the corrosion of aluminum wirings in the long run. The second method may produce or result in problems such as hillock formation, segregation, or recrystallization, etc. when the temperature of the heat treatment is over 300° C., which are generally related to the low melting point of aluminum.

The third method has been disclosed in Japanese Patent Publication No. 83-12343 and Korean Patent Laid-Open Publication No. 2000-27241, which relates to a method for removing chlorine residues by means of an etching gas containing fluorine, and then removing a photoresist through an ashing process. However, this method may result in a problem where undercuts 114 on a titanium-containing layer (e.g., a TiN or TiW barrier) occur due to the fluorine-containing plasma, as shown in FIG. 1c. In addition, an underlying oxide layer may be damaged, and the aluminum may be changed to $AlF_3$ (which can result in metal degradation). As a result, the reliability of semiconductor device may be conspicuously deteriorated.

In another method for manufacturing a semiconductor device, for the purpose of preventing reaction between chlorine residues and water when a substrate is exposed to air, an etching system is equipped with an ashing chamber so that a process of stripping a photoresist is performed in situ. Especially, before stripping a photoresist by means of plasma containing fluorine, chlorine residues are changed to hydrogen chloride (HCl) by means of $H_2O$ plasma, and then hydrogen chloride is exhausted by a pump, so that chlorine residues existing on surfaces of aluminum layer are generally removed. However, there are the same problems as the above-explained method has, which are caused by plasma containing fluorine.

To solve these problems, Korean Patent Publication No. 95-5351 discloses a method for preventing corrosion of a metal layer, comprising a plasma process using mixed gases of oxygen ($O_2$) and ammonia ($NH_3$). In addition, Korean Patent Laid Open Publication No. 2001-35852 discloses a method for preventing corrosion of a metal layer, comprising the step of exposing an object to plasma formed of mixed gases of $H_2N_2$ and oxygen. However, in case of using such mixed gases, a degree of preventing corrosion of a metal layer depends on a mixture ratio of gases. Moreover, these methods tend to have little effect on the prevention of corrosion.

SUMMARY OF THE INVENTION

It is, therefore, an object of the present invention to provide a method for preventing metal corrosion in a semiconductor device (and, in one embodiment, simultaneously preventing formation of a bridge between metal wirings), thereby improving the profile of metal layer and the reliability and yield of the semiconductor device.

To achieve the above object(s), a method for preventing metal corrosion of a metal layer in a semiconductor device or integrated circuit according to the present invention comprises the steps of: etching a metal layer in a chamber, the metal layer having a photoresist pattern thereon or thereover; oxidizing a surface of the metal layer using a plasma comprising $N_2O$ in the chamber; and removing the photoresist.

Preferably, the present method further includes the step of removing a portion of the oxidized metal surface by sputter etching using an inert gas, after the step of oxidizing the surface of the metal layer. The inert gas includes at least one member of the group consisting of He, Ne, Ar, Kr, Xe and Rn. Also, the metal layer preferably comprises one or more layers consisting essentially of aluminum or an aluminum alloy (e.g., aluminum-copper or aluminum-silicon alloy).

The etch of the metal layer may be performed by dry etching using a plasma which includes chlorine. In addition, after the metal layer is etched, the metal layer may have a width greater than a desired or predetermined critical dimension by 50 to 150 Å. Further, the oxidized metal surface may have a width or thickness of from 50 to 150 Å.

In addition, the step of removing the photoresist preferably comprises ashing with a plasma including a chlorine source gas (e.g., $Cl_2$) and a hydrofluorocarbon gas (e.g., $CHF_3$).

These and other aspects of the invention will become evident by reference to the following description of the invention, often referring to the accompanying drawings.

DETAILED DESCRIPTION OF THE INVENTION

FIGS. 2a to 2d are cross-sectional views of a semiconductor device illustrating a method for preventing a metal corrosion according to the present invention.

Figure 1A:
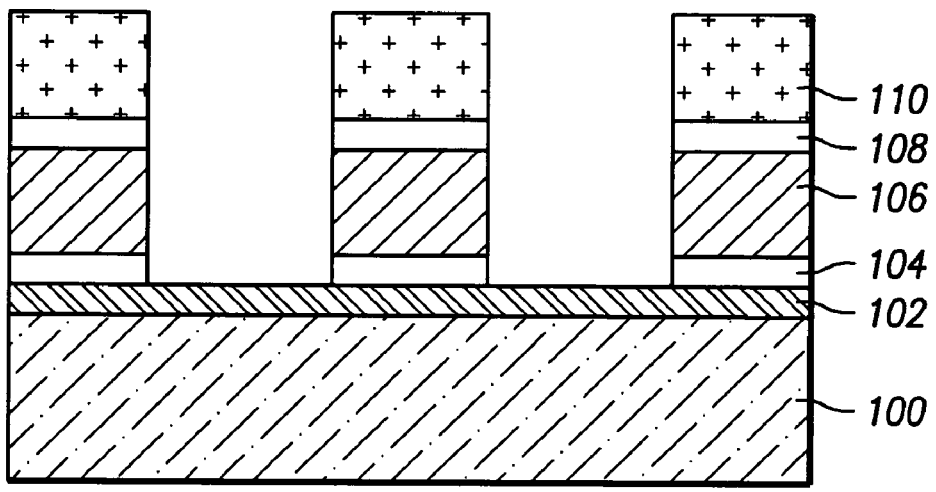
FIGS. 1a to 1c illustrate a conventional method for forming an aluminum wiring in a semiconductor device.
Figure 1B:
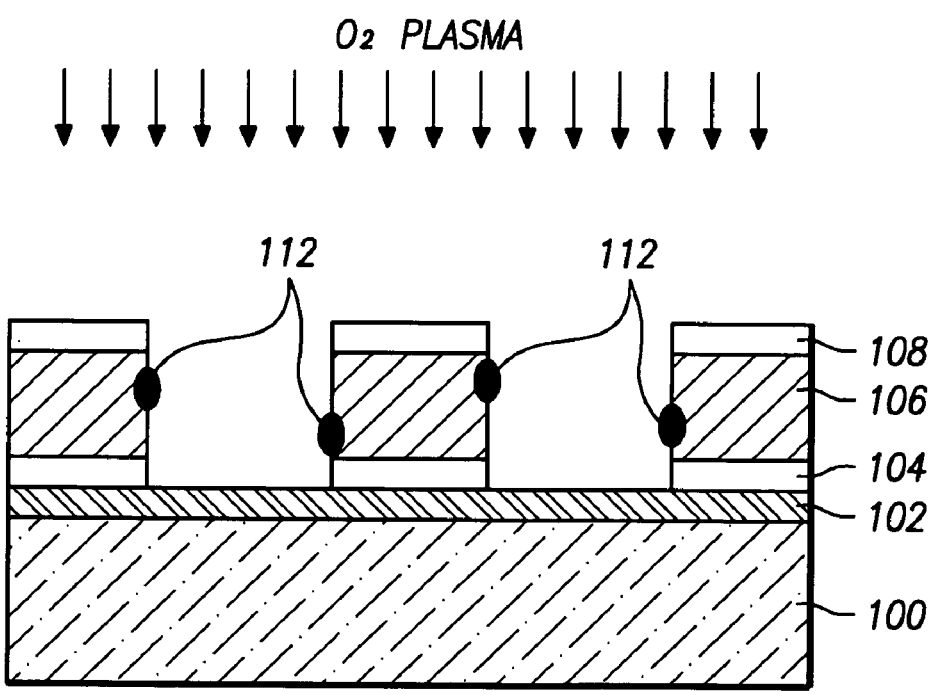
Figure 1C:
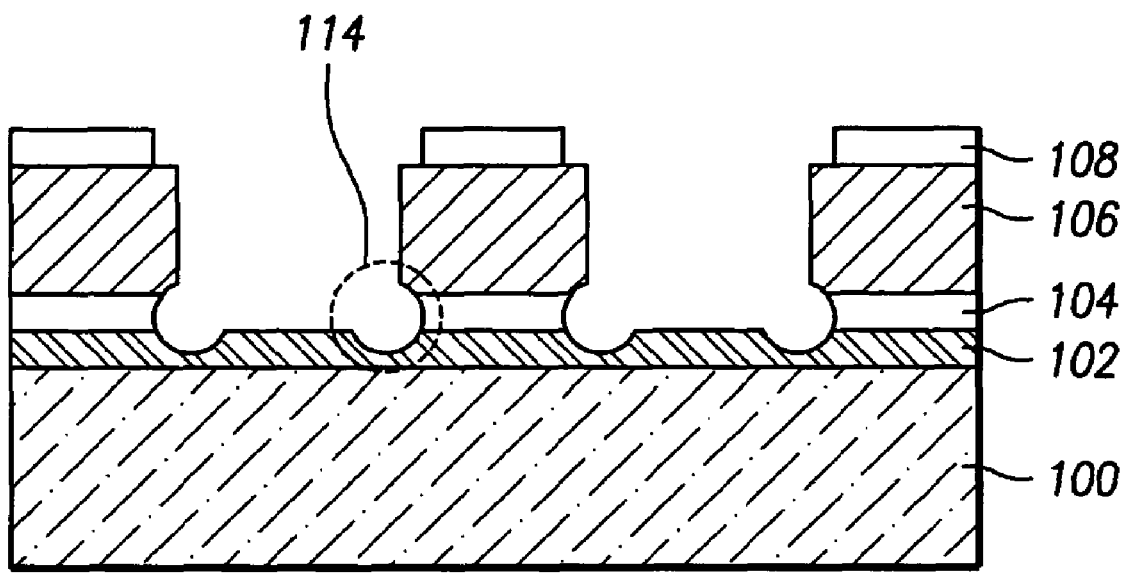
Figure 2A:
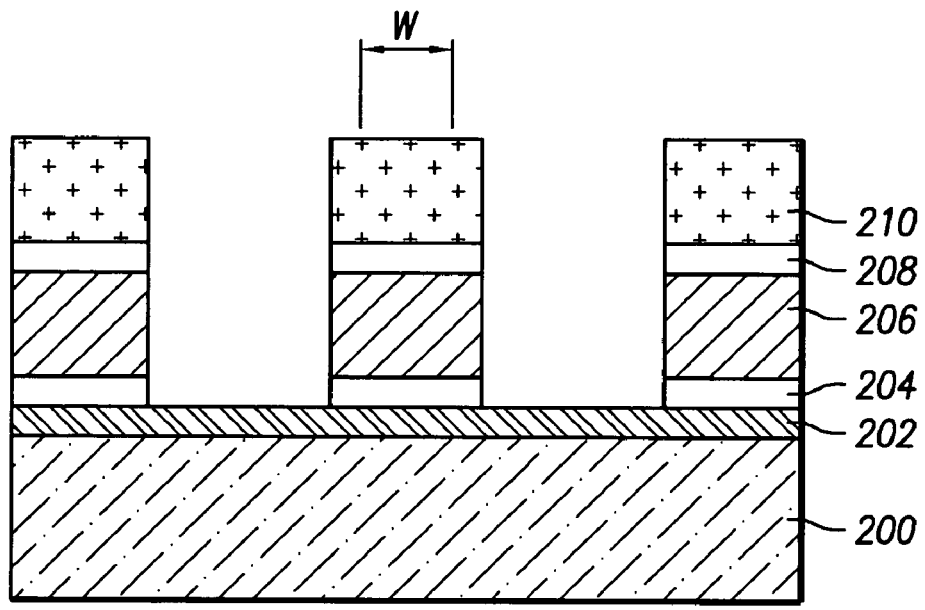
FIGS. 2a to 2d illustrate a method for preventing corrosion of a metal layer in a semiconductor device, according to the present invention.

First, as shown in FIG. 2a, a photoresist 210 is coated and patterned over a substrate 200 on which an oxide layer 202, barrier 204, metal layer 206 and antireflective coating 208 are formed in successive order. Then, antireflective coating 208, metal layer 206 and barrier 204 are dry-etched using a plasma including a chlorine source gas such as $Cl_2$, $BCl_3$ and/or the like. Such dry etching preferably comprises Reactive Ion Etching (RIE).

Metal layer 206 may comprise a single layer or a plurality of layers, at least one of which preferably consists essentially of aluminum, aluminum alloy (for example, Al—Cu or Al—Ti), aluminum-silicon alloy (for example, Al—Si, Al—Si—Cu, or Al—Ti—Si), and so on. However, materials are not limited to these metals or alloys thereof, and any metal or alloy thereof is available for the metal layer 206 in the present invention.

In case a metal layer 206 comprises aluminum, an aluminum layer may be weak for electromigration because aluminum has a relatively low melting point of around 660° C. As a result, atoms of aluminum may be apt to move due to movement of electrons. Preferably, in order to prevent electromigration, a barrier 204 comprising or consisting essentially of Ti, TiN, W or TiW can be formed under an aluminum layer. In one embodiment, barrier 204 consists essentially of a Ti/TiN bilayer. Furthermore, in case a metal layer 206 comprises aluminum, an antireflective coating 208 comprising or consisting essentially of TiN or a Ti/TiN bilayer is preferably formed on the aluminum layer 206, which can suppress or prevent hillock formation, electromigration and stress migration of the aluminum layer 206, thus improving the reliability of the wiring. Barrier 204 and antireflective coating 208 are optional components, not indispensable components.

A width W of a metal layer 206 is preferably wider than the desired (or predetermined) critical dimension by 50 to 150 Å. Generally, that width corresponds to or is considered for a thickness of a lateral metal oxide to be formed in a subsequent process (e.g., plasma oxidation). In a conventional etching process, metal layer 206 may be overetched to a limited extent. However, in this embodiment according to the present invention, metal layer 206 is not overetched, so that portions of oxide layer 202 below metal layer 206 are not etched.

Figure 2B:
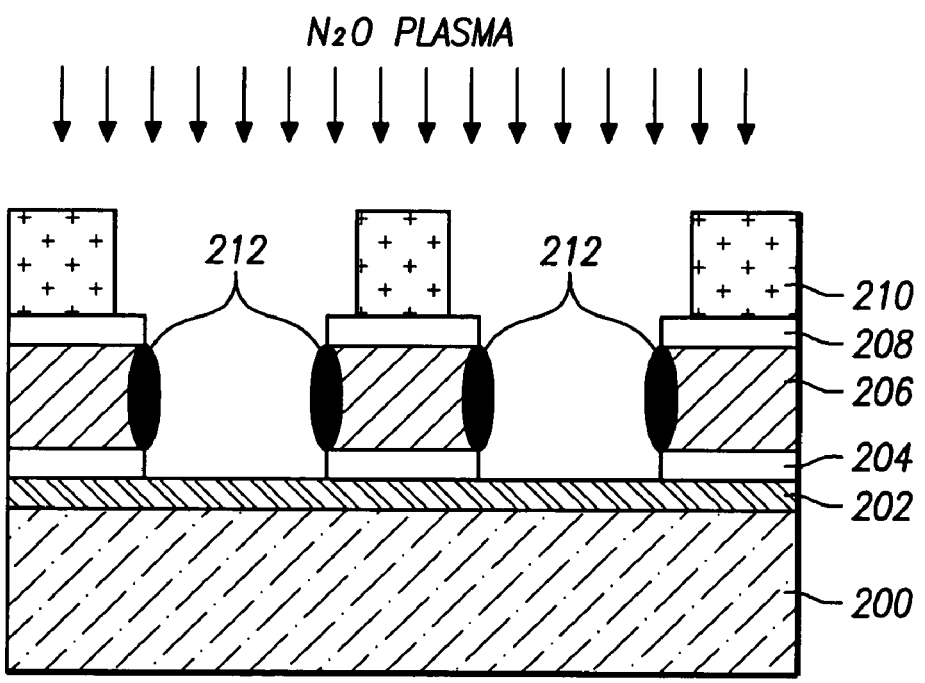

Next, as shown in FIG. 2b, a surface of metal layer 206 (e.g., exposed as a result of the metal etching step) is oxidized using a plasma comprising $N_2O$. The oxidation may be performed in the same chamber as the etching process for metal layer 206. Thus, the metal etch and oxidation steps may be performed continuously, or oxidation may be conducted in situ. During such an oxidization process, lateral surfaces of a metal layer 206 are oxidized so that lateral oxides 212 are formed. The lateral oxides 212 may have a width (or thickness) of from around 50 Å to around 150 Å. Chlorine residues remaining or existing on lateral surfaces of metal layer 206 after the metal etch step are oxidized and removed by the $N_2O$-containing plasma. In order to effectively remove the chlorine residues, the present method further includes the steps of: exposing metal surfaces that may have chlorine residues thereon to an $H_2O$-containing plasma before oxidization using the $N_2O$-containing plasma, so as to change the chlorine residues to hydrogen chloride (or other volatile species); and exhausting the hydrogen chloride and/or other volatile, chlorine-containing species.

Figure 2C:
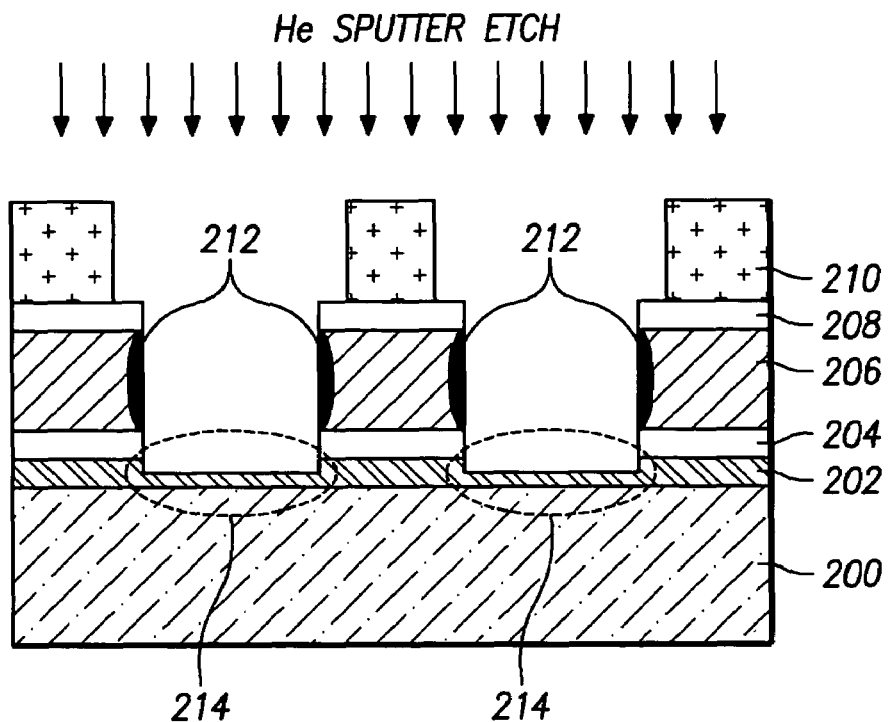

Next, as shown in FIG. 2c, a sputter etch process or ion beam etch process is performed. Sputter etching or ion beam etching is a method for physically etching a target by means of accelerating ions in a plasma state which are changed from an inert gas. In this process, a portion of lateral oxides 212 is removed (e.g., the vertically exposed portions of lateral oxides 212) and a portion of oxide layer 202 is also etched at the same time. Thus, the formation of a bridge (or short circuit between adjacent metal lines, sometimes known as a "stringer") can be suppressed or prevented, thereby improving a profile of metal layer 206. Moreover, a photoresist 210 is partially removed. It is preferable that the inert gas comprises at least one of the noble gases (i.e., He, Ne, Ar, Kr, Xe and Rn).

Figure 2D:
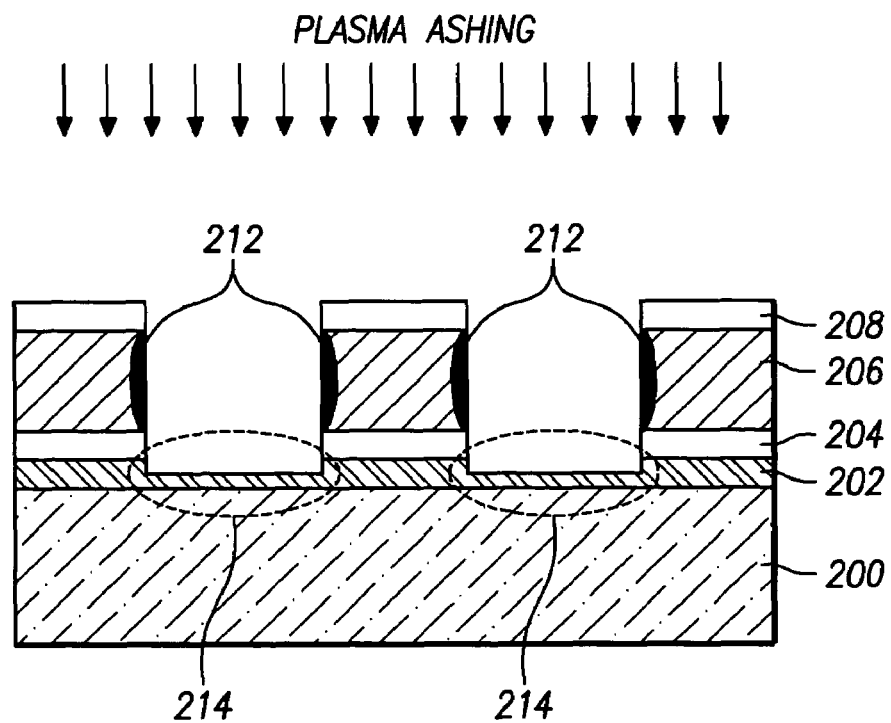

Finally, as shown in FIG. 2d, photoresist 210 is removed. Preferably, the removal of photoresist 210 comprises a plasma ashing process using a chlorine source gas (e.g., $Cl_2$, $BCl_3$, HCl, etc., preferably $Cl_2$) and a hydrofluorocarbon gas (e.g., $C_xH_yF_z$, where x is an integer of from 1 to 4, y and z are each an integer of at least 1, and (y+z)=2x+2, such as $CHF_3$, $CH_2F_2$, $C_2H_2F_4$, $C_2HF_5$, etc., preferably $CHF_3$). In addition, it is preferable that the chamber for forming the ashing plasma has working conditions of: a pressure of from about 0.7 to about 1.3 Torr; an electric power of from about 800 to about 1700 W; an operating time of from about 20 to about 80 seconds; and a temperature less than room temperature.

It is also preferable that the above-described series of processes, from the metal etch step as shown in FIG. 2a to the photoresist removal step as shown in FIG. 2d, are continuously performed in the same etching chamber.

The above-described embodiment according to the present invention has explained a series of processes, comprising the steps of: etching a metal layer in a chamber, the metal layer having thereon or thereover a predetermined photoresist pattern; oxidizing surfaces of the metal layer using a $N_2O$-containing plasma; removing a portion of the oxidized metal layer surfaces and simultaneously etching an exposed oxide layer by sputter etching using an inert gas; and removing the photoresist by plasma ashing. However, the step of sputter etching using an inert gas may be omitted. Namely, the method according to the present invention may comprise the following steps of: etching a metal layer under a photoresist pattern; oxidizing surfaces of the metal layer with a plasma comprising $N_2O$; and removing the photoresist by plasma ashing.

In a method for preventing a metal corrosion in a semiconductor device or integrated circuit according to the present invention, a metal layer is dry-etched, lateral oxides are formed using a $N_2O$-containing plasma in situ, and then portions of the lateral oxides and an oxide layer (exposed as a result of the metal etch) are simultaneously removed by sputter etching using an inert gas. Therefore, metal corrosion and bridges (a type of short circuit between adjacent metal lines) can be suppressed or prevented, improving a profile of the metal layer. Moreover, undercuts into a barrier layer, damage to an oxide layer and/or deformation of the metal layer can be suppressed or prevented. As a result, the present invention may improve the reliability and yield of a semiconductor device.

While the present invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for preventing metal corrosion in a semiconductor or integrated circuit, comprising the steps of:
    forming an oxide layer on a substrate;
    forming a metal layer on the oxide layer;
    etching the metal layer in a chamber to expose a surface of the oxide layer, the metal layer having a photoresist pattern thereon or thereover;
    oxidizing lateral surfaces of the metal layer using a plasma comprising $N_2O$ in the chamber to form lateral metal oxides;
    removing simultaneously a portion of the oxide layer exposed by etching the metal layer and vertically exposed portions of said lateral metal oxides by sputter etching with an inert gas in the chamber, and
    removing the photoresist.

2. The meted of claim 1, wherein the inert gas includes at least one member of the group consisting of He, Ne, Ar, Kr, Xe and Rn.

3. The method of claim 1, wherein the metal layer comprises one or more aluminum layers consisting essentially of aluminum or aluminum alloy.

4. The method of claim 3, wherein the one or more aluminum layers consists essentially of an aluminum alloy selected from the group consisting of aluminum-copper, aluminum-titanium, and aluminum-silicon alloys.

5. The method of claim 3, wherein the aluminum alloy is selected from the group consisting of aluminum-copper and aluminum-copper-silicon alloys.

6. The method of claim 3, wherein the metal layer further comprises one or more barrier layers.

7. The method of claim 6, wherein the one or more barrier layers comprises a Ti, TiN, W or TiW layer.

8. The method of claim 7, wherein the one or more barrier layers comprises a Ti/TiN bilayer.

9. The method of claim 3, wherein the metal layer further comprises an antireflective coating.

10. The method of claim 9, wherein the antireflective coating comprises a TiN layer.

11. The method of claim 9, wherein the antireflective coating comprises a Ti/TiN bilayer.

12. The method of claim 1, wherein etching the metal layer comprises dry etching with a plasma comprising chlorine.

13. The method of claim 12, wherein the dry etching comprises reactive ion etching (RIE).

14. The method of claim 1, wherein the metal layer has a width 50 to 150 Å greater than a desired or predetermined critical dimension after the metal layer is etched.

15. The method of claim 1, wherein the oxidized metal surface has a width of from 50 to 159 Å.

16. The method of claim 1, wherein the step of removing the photoresist comprises ashing with a plasma comprising a chlorine source gas and a hydrofluorocarbon gas.

17. The method of claim 1, wherein the step of removing the photoresist comprises ashing with a plasma comprising $Cl_2$ and $CHF_3$ gases.

18. The method of claim 6, wherein the one or more barrier layers are under the metal layer.

19. The method of claim 9, wherein the antireflective coating is on the metal layer.

* * * * *